United States Patent
Kotlyar et al.

(10) Patent No.: US 9,911,835 B2
(45) Date of Patent: *Mar. 6, 2018

(54) TUNNELING FIELD EFFECT TRANSISTORS (TFETS) FOR CMOS ARCHITECTURES AND APPROACHES TO FABRICATING N-TYPE AND P-TYPE TFETS

(71) Applicant: Intel Corporation, Santa Clara, CA (US)

(72) Inventors: Roza Kotlyar, Portland, OR (US); Stephen M. Cea, Hillsboro, OR (US); Gilbert Dewey, Hillsboro, OR (US); Benjamin Chu-Kung, Hillsboro, OR (US); Uygar E. Avci, Portland, OR (US); Rafael Rios, Portland, OR (US); Anurag Chaudhry, Portland, OR (US); Thomas D. Linton, Jr., San Jose, CA (US); Ian A. Young, Portland, OR (US); Kelin J. Kuhn, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/410,548

(22) Filed: Jan. 19, 2017

(65) Prior Publication Data

US 2017/0133493 A1    May 11, 2017

Related U.S. Application Data

(60) Continuation of application No. 15/209,552, filed on Jul. 13, 2016, now Pat. No. 9,583,602, which is a
(Continued)

(51) Int. Cl.
*H01L 29/16*    (2006.01)
*H01L 29/66*    (2006.01)
(Continued)

(52) U.S. Cl.
CPC ...... *H01L 29/66977* (2013.01); *H01L 27/092* (2013.01); *H01L 29/045* (2013.01);
(Continued)

(58) Field of Classification Search
None
See application file for complete search history.

(56) References Cited

U.S. PATENT DOCUMENTS 8,316,568 B2    11/2012 Briggs
8,368,127 B2    2/2013 Zhu et al.
(Continued)

FOREIGN PATENT DOCUMENTS

WO    WO-2008/123491    10/2008
WO    WO-2012/085715    6/2012

OTHER PUBLICATIONS

Second Office Action from Chinese Patent Application No. 201380054199.X dated May 10, 2017, 4 pgs.
(Continued)

*Primary Examiner* — Bilkis Jahan
(74) *Attorney, Agent, or Firm* — Schwabe, Williamson & Wyatt, P.C.

(57) ABSTRACT

Tunneling field effect transistors (TFETs) for CMOS architectures and approaches to fabricating N-type and P-type TFETs are described. For example, a tunneling field effect transistor (TFET) includes a homojunction active region disposed above a substrate. The homojunction active region includes a relaxed Ge or GeSn body having an undoped channel region therein. The homojunction active region also includes doped source and drain regions disposed in the relaxed Ge or GeSn body, on either side of the channel region. The TFET also includes a gate stack disposed on the
(Continued)

channel region, between the source and drain regions. The gate stack includes a gate dielectric portion and gate electrode portion.

21 Claims, 14 Drawing Sheets

Related U.S. Application Data division of application No. 14/521,200, filed on Oct. 22, 2014, now Pat. No. 9,412,872, which is a division of application No. 13/678,867, filed on Nov. 16, 2012, now Pat. No. 8,890,120.

(51) Int. Cl.

| | | |
|---|---|---|
| H01L 29/78 | (2006.01) | |
| H01L 29/739 | (2006.01) | |
| H01L 29/161 | (2006.01) | |
| H01L 29/06 | (2006.01) | |
| H01L 29/24 | (2006.01) | |
| H01L 29/267 | (2006.01) | |
| H01L 27/092 | (2006.01) | |
| H01L 29/04 | (2006.01) | |
| H01L 29/10 | (2006.01) | |
| H01L 29/165 | (2006.01) | |
| H01L 29/20 | (2006.01) | |
| H01L 29/423 | (2006.01) | |
| H01L 29/786 | (2006.01) | |

(52) U.S. Cl.
CPC ........ *H01L 29/068* (2013.01); *H01L 29/0676* (2013.01); *H01L 29/1054* (2013.01); *H01L 29/16* (2013.01); *H01L 29/161* (2013.01); *H01L 29/165* (2013.01); *H01L 29/20* (2013.01); *H01L 29/24* (2013.01); *H01L 29/267* (2013.01); *H01L 29/42392* (2013.01); *H01L 29/7391* (2013.01); *H01L 29/785* (2013.01); *H01L 29/7842* (2013.01); *H01L 29/78603* (2013.01); *H01L 29/78642* (2013.01); *H01L 29/78684* (2013.01); *H01L 29/78696* (2013.01)

(56) References Cited

U.S. PATENT DOCUMENTS

| | | | | |
|---|---|---|---|---|
| 8,890,120 | B2 * | 11/2014 | Kotlyar | H01L 29/785 |
| | | | | 257/27 |
| 9,136,363 | B2 * | 9/2015 | Park | H01L 29/66356 |
| 9,583,602 | B2 * | 2/2017 | Kotlyar | H01L 29/785 |
| 2007/0115716 | A1 | 5/2007 | Saito et al. | |
| 2007/0252211 | A1 * | 11/2007 | Yagishita | H01L 29/045 |
| | | | | 257/351 |
| 2008/0067607 | A1 | 3/2008 | Verhulst et al. | |
| 2008/0224224 | A1 | 9/2008 | Vandenderghe et al. | |
| 2009/0026553 | A1 | 1/2009 | Bhuwalka et al. | |
| 2009/0206375 | A1 * | 8/2009 | Saha | H01L 27/098 |
| | | | | 257/281 |
| 2010/0025766 | A1 | 2/2010 | Nuttinck et al. | |
| 2010/0213477 | A1 | 8/2010 | Xu et al. | |
| 2011/0049474 | A1 | 3/2011 | Bjoerk et al. | |
| 2011/0049476 | A1 | 3/2011 | Bjoerk et al. | |
| 2011/0084319 | A1 | 4/2011 | Zhu et al. | |
| 2011/0254080 | A1 | 10/2011 | Doris et al. | |
| 2013/0264544 | A1 * | 10/2013 | Karg | B82Y 10/00 |
| | | | | 257/24 |
| 2013/0285017 | A1 * | 10/2013 | Le | H01L 29/42392 |
| | | | | 257/27 |

OTHER PUBLICATIONS

Dewey, et al. "Fabrication, Characterization, and Physics of III-V Heterojunction Tunneling Field Effect Transistors (H-TFET) for Steep Sub-Threshold Swing," Electron Devices Meeting (IEDM), 2011 IEEE International, pp. 33.6.1-33.6.4.

Dewey, et al., "III-V Field Effect Transistors for Future Ultra-Low Power Applications," (Invited Paper), VLSI Technology (VLSIT), 2012 Symposium on Components, Circuits, Devices & Systems, pp. 45-46.

Avci, et al. "Understanding the Feasibility of Scaled III-V TFET for Logic By Bridging Atomistic Simulations and Experimental Results," VLSI Technology (VLSIT), 2012 Symposium on Components, Circuits, Devices & Systems, pp. 183-184.

Koester, et al. "Are Si/SiGe Tunneling Field-Effect Transistors a Good Idea" The Electrochemical Society, ECS Transactions, 33 (6) (2010), pp. 357-361.

Avci, et al. "Comparison of Power and Performance for the TFET and MOSFET and Considerations for P-TFET," Nanotechnology (IEEE-NANO), 2011 11th IEEE Conference on Components, Circuits, Devices & Systems, 2011, pp. 869-872.

International Search Report and Written Opinion for PCT Patent Application No. PCT/US2013/045504, dated Nov. 19, 2013, 11 pgs.

Non-Final Office Action from U.S. Appl. No. 13/678,867 dated Jan. 22, 2014, 11 pgs.

International Preliminary Report on Patentability from PCT/US2013/045504 dated May 28, 2015, 8 pgs.

Suyog Gupta, et al. "Band Structure and Ballistic Electron Transport Simulations in GeSn Alloys," pp. 3-6, International Conference on Simulation of Semiconductor Processes and Devices 2012 (SISPAD' 12), Sep. 5-7, 2012, Denver, CO, USA pp. 3 & 6.

Office Action for Taiwan Patent Application No. 102140878, dated Jul. 28, 2015, 17 pgs.

Extended European Search Report from European Patent Application No. 13854345.9 dated May 23, 2016, 6 pgs.

Office Action and Search Report from Taiwan Patent Application No. 104135227 dated Jun. 2, 2016, 4 pgs.

Non-Final Office Action from U.S. Appl. No. 14/521,200 dated Aug. 14, 2015, 14 pgs.

Final Office Action from U.S. Appl. No. 14/521,200 dated Jan. 25, 2016, 8 pgs.

Notification of the First Office Action from Chinese Patent Application No. 201380054199.X dated Oct. 8, 2016, 8 pgs.

Notice of Preliminary Rejection from Korean Patent Application No. 10-2015-7009450 dated Jul. 11, 2016, 4 pgs.

Koswatta, Siyuranga O., et al., "1D Broken-gap Tunnel Transistor with MOSFET-like On-currents and Sub-60m V/dec Subthreshold Swing", Electron Devices Meeting, Baltimore, IEEE, 2009, 4 pgs.

Krishnamohan, Tejas , et al., "Double-Gate Strained-Ge Heterostructure Tunneling FET (TFET) With Record High Drive Currents and <60mV/dec Subthreshold Slope", Electron Devices Meeting, San Francisco: IEEE, 2008, 3 pgs.

\* cited by examiner

Table 600

| confinement | m(L111) | m(L11-1) | m(L-111) | m(L1-11) |
|---|---|---|---|---|
| 001 | 0.12 | 0.12 | 0.12 | 0.12 |
| 111 | 1.59 | 0.09 | 0.09 | 0.09 |
| 1-10 | 0.08 | 0.08 | 0.22 | 0.22 |

US 9,911,835 B2

TUNNELING FIELD EFFECT TRANSISTORS (TFETS) FOR CMOS ARCHITECTURES AND APPROACHES TO FABRICATING N-TYPE AND P-TYPE TFETS

CROSS-REFERENCE TO RELATED APPLICATIONS

This application is a continuation of U.S. patent application Ser. No. 15/209,552, filed on Jul. 13, 2016, which is a divisional of U.S. patent application Ser. No. 14/521,200, filed on Oct. 22, 2014, now U.S. Pat. No. 9,412,872, issued on Aug. 9, 2016, which is a divisional of U.S. patent application Ser. No. 13/678,867, filed on Nov. 16, 2012, now U.S. Pat. No. 8,890,120, issued on Nov. 18, 2014, the entire contents of which are hereby incorporated by reference herein.

TECHNICAL FIELD

Embodiments of the invention are in the field of semiconductor devices and, in particular, tunneling field effect transistors (TFETs) for CMOS architectures and approaches to fabricating N-type and P-type TFETs.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, leading to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. On bulk silicon substrates, however, the fabrication process for tri-gate transistors often encounters problems when aligning the bottom of the metal gate electrode with the source and drain extension tips at the bottom of the transistor body (i.e., the "fin"). When the tri-gate transistor is formed on a bulk substrate, proper alignment is needed for optimal gate control and to reduce short-channel effects. For instance, if the source and drain extension tips are deeper than the metal gate electrode, punch-through may occur. Alternately, if the metal gate electrode is deeper than the source and drain extension tips, the result may be an unwanted gate capacitance parasitics.

Many different techniques have been attempted to reduce junction leakage of transistors. However, significant improvements are still needed in the area of junction leakage suppression.

DESCRIPTION OF THE EMBODIMENTS

Figure 1:
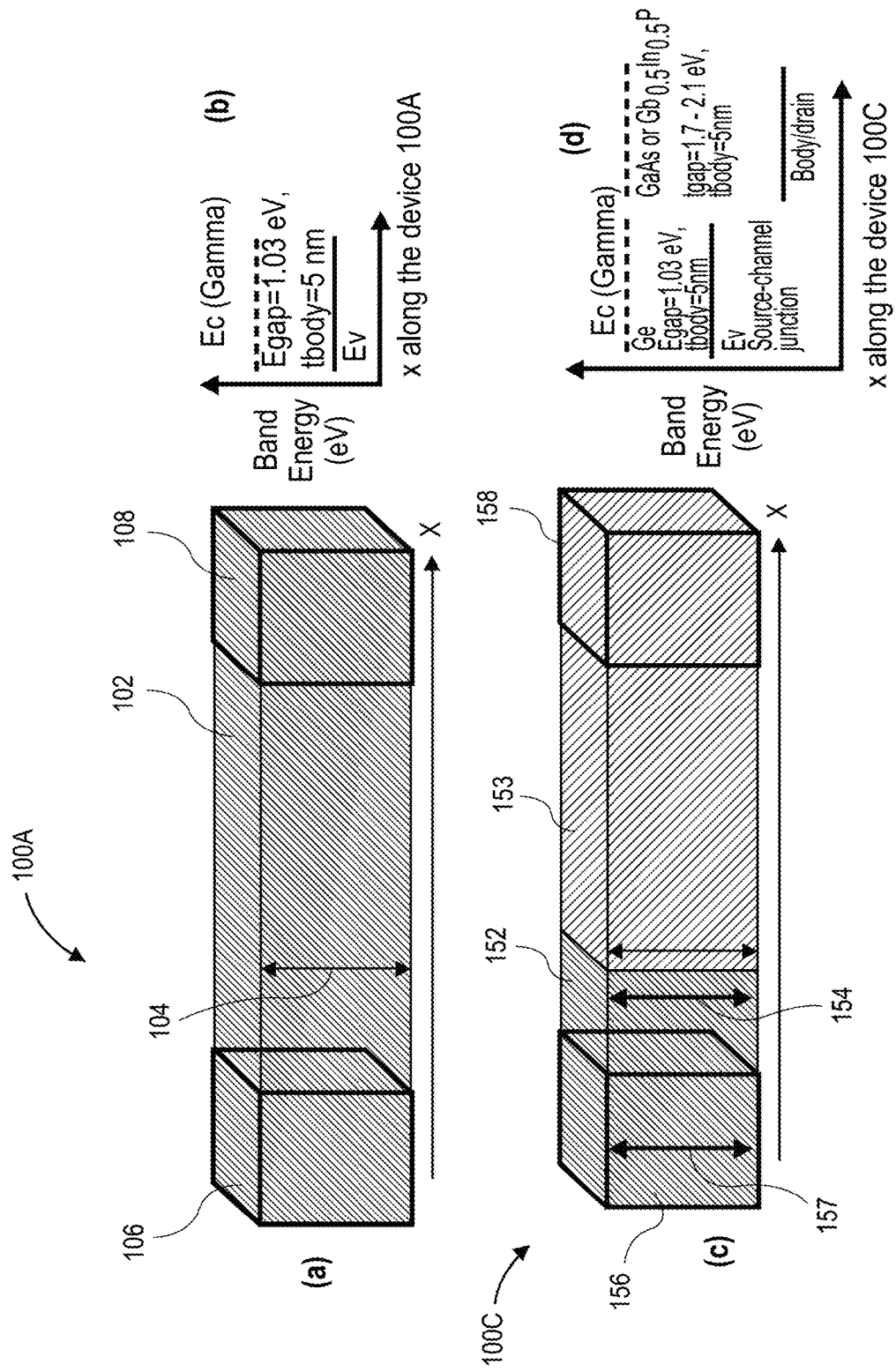
FIG. 1 illustrates angled views of (a) a portion of a homojunction TFET device having an unstrained Ge or GeSn narrow body, in accordance with an embodiment of the present invention, and (c) a portion of a hetero-junction TFET device having an unstrained narrow source/channel junction, in accordance with an embodiment of the present invention. In (b), the leading band edges are shown for a relaxed 5 nm Ge double gate device, corresponding to (a). The leading edges for the band alignment for the structure of (c) are shown in (d).

Tunneling field effect transistors (TFETs) for CMOS architectures and approaches to fabricating N-type and P-type TFETs are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein target approaches to, and the resulting devices from, using an indirect bandgap to direct bandgap transition for complementary N-type and P-type TFET devices. In more specific embodiments, the TFET devices are fabricated from Group IV materials. The devices may have applications in logic architectures, and in lower power device architectures. One or more embodiments are directed to achieving high performance N-type and P-type TFET devices by using indirect to direct bandgap transitions in group IV materials. Methods and structures to engineer such devices are described herein. In one embodiment, TFETs are used to achieve steeper subthreshold slope (SS) versus a corresponding metal oxide semiconductor field effect transistor (MOSFET) with a thermal limit of approximately 60 mV/decade. Generally, embodiments described herein may be suitable for high performance or scaled transistors for logic devices having low power applications.

To provide a background context, due to the presence of direct band gaps and a wide variety of hetero-structure band alignments, group III-V material based TFETs should offer high drive current and low SS. A SS less than 60 mV/decade has been achieved for a group III-V material hetero-structure pocket N-type TFET. With further device optimization of equivalent oxide thickness (EOT), body scaling, and barrier engineering, the group III-V material N-type TFET is expected to outperform group III-V material MOSFETs at a low target VCC, e.g., a VCC of approximately 0.3V. However, the low density of conduction band states in group III-V materials may present a fundamental limitation on achieving both a low SS and high on current ($I_{ON}$) in P-type TFETs based on group III-V materials.

Furthermore, the $I_{ON}$ current in TFETs fabricated in or from technologically important group IV materials, such as silicon (Si), germanium (Ge), or silicon germanium (SiGe), may be limited by a larger bandgap (e.g., 1.12 eV in Si) and/or a low indirect band gap tunneling current. In Si and Ge, the top valence bands are at the gamma point, while the lowest conduction bands are at the delta point in Si and L point in Ge. The tunneling between the conduction band and the valence band at the source/channel junction is enabled by a phonon-assisted two-step process. The process typically has a low probability which may lead to a low $I_{ON}$ for TFETs based on indirect bandgap materials. For example, in the best performing Si/SiGe hetero-structure TFET the experimentally achieved $I_{ON}$ is approximately 40 nA/micron at 1V gate overdrive, which is approximately 25 times lower than the above described $I_{ON}$ for group III-V material devices at 0.3V gate overdrive. A corresponding high $I_{ON}$ for Si, Ge, or SiGe based TFETs has not yet been achieved. Accordingly, one or more embodiments described herein target approaches to fabricating high performance N-type and P-type TFETs with low SS and high $I_{ON}$ in the same material system.

In an embodiment, band engineering of a band structure of group IV materials, and their alloys, is used to achieve an indirect bandgap-to-direct bandgap transition for enabling N-type and P-type TFET devices in the same material. The group IV materials do not suffer from the low conduction density of states. Furthermore, with the engineered direct band gap, a high $I_{ON}$ and low SS can be achieved in both N-type and P-type TFETs fabricated in a same material. In specific embodiments, both unstrained and strained Ge-based or GeSn-based N-type and P-type TFETs are described.

In a first aspect, one or more embodiments described herein are directed to methods of achieving an indirect-direct bandgap transition for use in TFETs. For example, in one embodiment, wafer orientation and conduction band non-parabolicity effect is used to increase the conduction band gamma valley mass under confinement in a thin body fin field effect transistor (finfet) or nanowire Ge or germanium tin (GeSn) TFET. Such a device provides a conduction band gamma valley energy as the lowest conduction band edge to achieve the direct bandgap. In another embodiment, tensile strain in Ge, GeSn, or silicon germanium tin (SiGeSn) is used to achieve a direct bandgap. In another embodiment, alloying of Ge with Sn in relaxed GeSn or SiGeSn is used to achieve a direct bandgap. Specific embodiments of the above approaches are described below in association with FIGS. 5-11.

In a second aspect, one or more embodiments described herein are directed to structures for TFET devices which utilize a direct bandgap transition. For example, in one embodiment, a device is based on an unstrained Ge or GeSn narrow body homojunction TFET or an unstrained Ge or GeSn narrow source/channel junction hetero-structure TFET using finfet or nanowire/nanoribbon device geometries. The confinement leads to the indirect-to-direct bandgap transition at or below approximately 5 nm body thickness in finfet, or in a wide rectangular nanoribbon or a square nanowire. These devices are fabricated to have (100), (010) or (001) orientations at the device surfaces. The direct bandgap material is disposed either throughout the device, or in the source/channel junction of the device. In the drain/body of the hetero-structure device, a lattice-matched direct wide bandgap material is used to minimize the off state current ($I_{OFF}$) of the device. In another embodiment, a finfet or nanowire is based on an unstrained $Ge_{1-x}Sn_x$ homojunction TFET with the Sn content x>6%, although the requirement to have a narrow body to achieve the direct band gap may be relaxed in this case. Examples of the immediately above described devices are illustrated in FIG. 1, a description of which follows.

Generally, FIG. 1 illustrates angled views of (a) a portion 100A of a TFET device having an unstrained Ge or GeSn narrow body, e.g., at or less than approximately 5 nm dimension finfet or square nanowire/nanoribbon homojunction, and (c) a portion 100C of a TFET device having an unstrained narrow source/channel junction, e.g., at or less than approximately 5 nm dimension. The direct bandgap material is either throughout the device in (a), or in the source/channel junction in (c). In (b) of FIG. 1, the leading band edges are shown for a relaxed 5 nm Ge double gate device. To achieve the direct bandgap at the largest minimum body dimension, the confinement direction in the corresponding finfet is <100> (or <010>, or <001>), and the surface orientations are (100) (or (010), or (001)) in a wire/ribbon based device. In the hetero-structure in (c), i.e., portion 100C, the lattice-matched direct wide bandgap material is used to minimize the $I_{OFF}$ in the drain/body of the device. In an exemplary embodiment, an example choice for a hetero-structure in (c) is a Ge narrow source/channel junction and lattice matched relaxed III-V material GaAs or $Ga_{0.5}In_{0.5}P$ in the body and in the drain. The leading edges for the band alignment for the structure of (c) are shown in (d).

More specifically, referring again to FIG. 1, the portion 100A of a TFET device includes an undoped and unstrained Ge or GeSn narrow body 102 having a thickness 104. Source (Na/Nd) 106 and drain (Nd/Na) 108 regions are doped regions formed in the same Ge or GeSn material. The portion 100A may be used to fabricate a narrow body homojunction Ge or GeSn N-type or P-type TFET homojunction-based devices. In (b) the band energy (eV) as a function of the distance x along the structure 100A is provided for a device with 5 nm body dimension. The portion 100C of a TFET device includes an undoped and unstrained Ge or GeSn narrow body first portion 152 having a thickness 154. A lattice matched narrow body second portion 153 is also included and may be fabricated from a lattice matched Group III-V material as described above. Source (Na/Nd) 156 region is formed as a doped region of the Ge or GeSn material of 152 having a thickness 157, while drain (Nd/Na) 158 region is formed as a doped region of the lattice matched III-V material. The portion 100C may be used to fabricate a narrow source/channel junction for Ge or GeSn N-type or P-type TFET hetero-junction-based devices. In (d) the band energy (eV) as a function of the distance x along the structure 100C is provided for a device with 5 nm body dimension.

In another example of structures for TFET devices which utilize a direct bandgap transition, in an embodiment, a TFET device is based on a planar biaxial tensile strained Ge homojunction structure, with Ge strain obtained from a Ge film grown pseudomorphically on a relaxed substrate having a larger lattice constant. In a specific embodiment, possible selections for the substrate include, but are not limited to, $Ge_{1-x}Sn_x$ and $In_xGa_{1-x}As$. For example, the growth of biaxial tensile Ge and GeSn on $In_xGa_{1-x}As$ relaxed buffers layers may provide a suitable approach. However, in an embodiment, approximately 12.5% of Sn or approximately 30% of indium (In) is used to fabricate the direct bandgap material in an approximately 5 nm body dimension Ge-based TFET. In another embodiment, a planar biaxial tensile strained $Ge_{1-y}Sn_y$ with less than approximately 6% of Sn is used in a homojunction TFET device, with $Ge_{1-y}Sn_y$ strain obtained from a $Ge_{1-y}Sn_y$ film grown pseudomorphically on a relaxed substrate having a larger lattice constant. In a specific such embodiment, possibilities for the substrate include, but are not limited to, $Ge_{1-x}Sn_x$ and $In_xGa_{1-x}As$. Examples of the immediately above described devices are illustrated in FIG. 2A, a description of which follows.

Figure 2A:
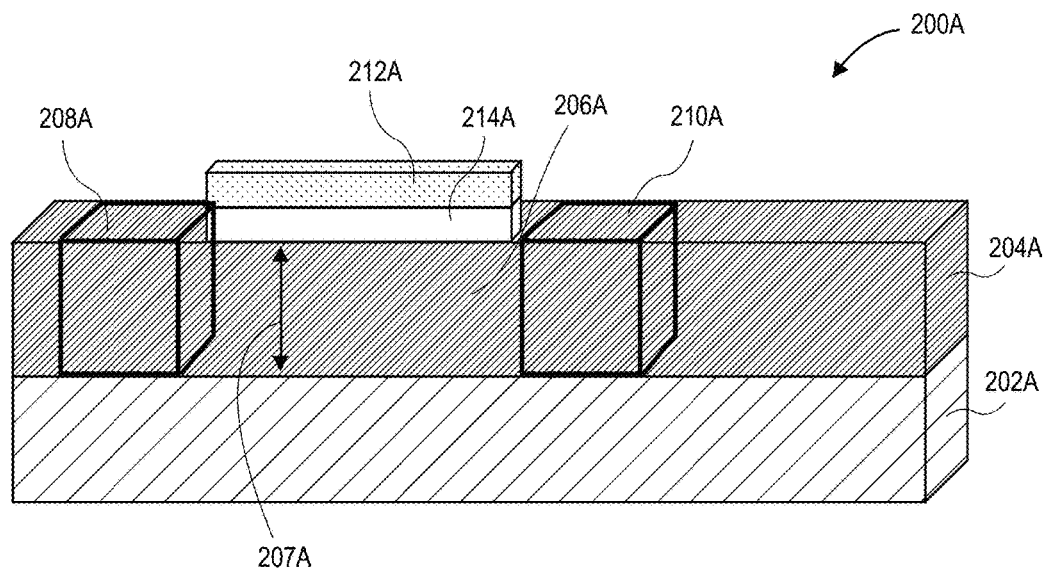
FIG. 2A illustrates an angled view of a portion of a planar biaxial tensile strained Ge or GeSn homojunction TFET device, in accordance with an embodiment of the present invention.

Generally, FIG. 2A illustrates an angled view of a portion 200A of a planar biaxial tensile strained Ge or GeSn homojunction TFET device, in accordance with an embodiment of the present invention. In one embodiment, strain for the device is derived from a layer grown pseudomorphically on a relaxed substrate with a larger lattice constant. Possibilities for the substrate include, but are not limited to, $Ge_{1-x}Sn_x$ and $In_xGa_{1-x}As$ having a larger lattice constants than a corresponding active layer. More specifically, referring again to FIG. 2A, the portion 200A of a TFET device includes an active layer 204A disposed on a substrate 202A. The substrate 202A is a relaxed buffer having a lattice constant greater than the lattice constant of the active layer 204A. An undoped body 206A having a thickness 207A is disposed between doped source (Na/Nd) region 208A and doped drain (Nd/Na) region 210A. A gate electrode 212A and gate dielectric 214A stack is formed above the undoped body 206A. In an embodiment, the structure 200A is used to fabricate a planar Ge or GeSn N-type or P-Type TFET having biaxial tensile stress.

In another example of structures for TFET devices which utilize a direct bandgap transition, in an embodiment, a TFET device is based on a suspended nanowire or nanoribbon Ge homojunction. In a specific embodiment, a TFET device is undercut in a channel region of a planar biaxial tensile strained Ge film, with Ge strain obtained from Ge film grown pseudomorphically on a relaxed substrate having a larger lattice constant. Possibilities for the substrate include, but are not limited to, $Ge_{1-x}Sn_x$ or $In_xGa_{1-x}As$. In a specific embodiment, a concentration of approximately 12.5% Sn or 30% In is used to produce a direct bandgap material for an approximately 5 nm body dimension Ge TFET.

Figure 2B:
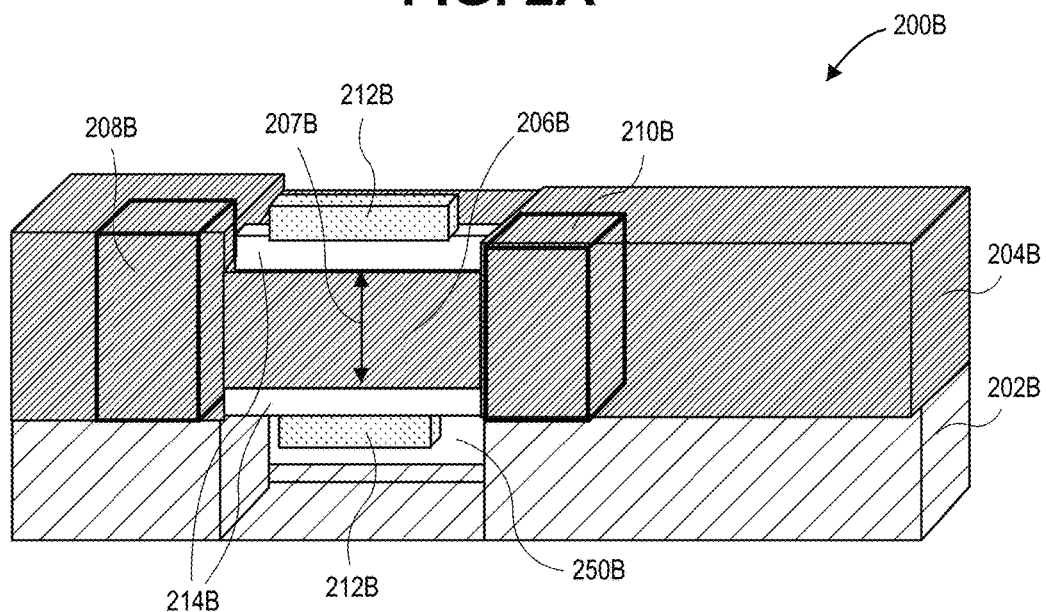
FIG. 2B illustrates an angled and partially cross-sectioned view of a portion of a suspended nanowire or nanoribbon Ge or GeSn homojunction based TFET device, in accordance with an embodiment of the present invention.

Generally, FIG. 2B illustrates an angled and partially cross-sectioned view of a portion 200B of a suspended nanowire or nanoribbon Ge homojunction based TFET device, in accordance with an embodiment of the present invention. In one embodiment, the device is fabricated by undercutting in a channel region of a planar biaxial tensile strained Ge film. Ge strain may be obtained from a Ge film grown pseudomorphically on a relaxed substrate having a larger lattice constant. Possibilities for the substrate include, but are not limited to, $Ge_{1-x}Sn_x$ or $In_xGa_{1-x}As$. In an embodiment, such a structure enables a direct bandgap due to a combined effect of confinement and stress. More specifically, referring again to FIG. 2B, the portion 200B of a TFET device includes an active layer 204B disposed on a substrate 202B. The substrate 202B is a relaxed wide buffer having a lattice constant greater than the lattice constant of the active layer 204B. The active layer 204B is undercut in region 250B to provide an undoped body 206B having a thickness 207B disposed between doped source (Na/Nd) region 208B and doped drain (Nd/Na) region 210B. A gate electrode 212B and gate dielectric 214B stack is formed to wrap around the undoped body 206B. In an embodiment, the structure 200B is used to fabricate a nanowire or nanoribbon Ge or GeSn N-type or P-Type TFET having biaxial tensile stress.

In another example of structures for TFET devices which utilize a direct bandgap transition, in an embodiment, a TFET device is based on a tri-gate or finfet Ge homojunction. In one embodiment, the device is fabricated by cutting a layer region into a fin in a channel region of a planar biaxial tensile strained Ge film. In a specific embodiment, Ge strain is obtained from a Ge film grown pseudomorphically on a relaxed substrate having a larger lattice constant. Possibilities for the substrate include, but are not limited to, $Ge_{1-x}Sn_x$ or $In_xGa_{1-x}As$. Such a structure may enable a direct bandgap due to a combined effect of confinement and uniaxial tensile stress. In one embodiment, the uniaxial tensile stress and the transport directions are along one of the principal crystal orientations of <100>, <010>, or <001>.

Figure 2C:
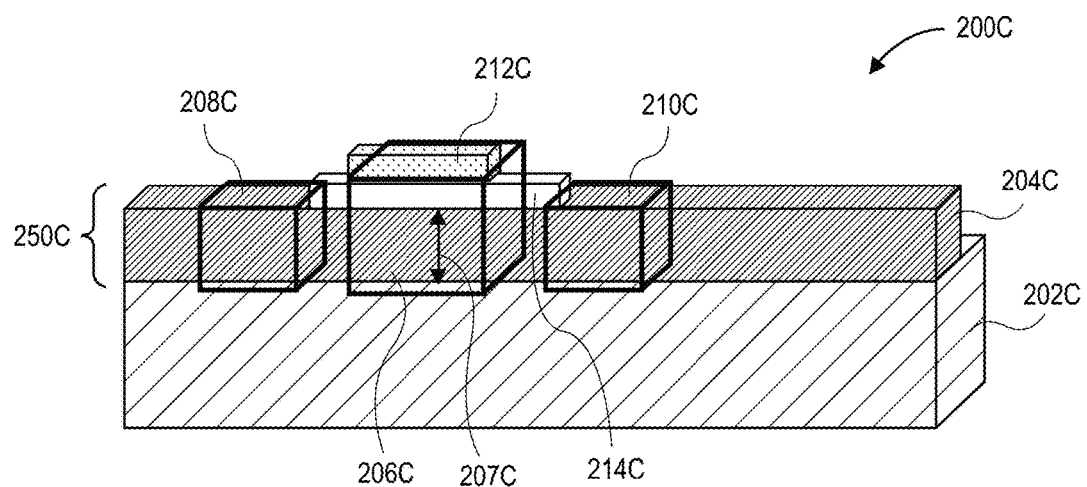
FIG. 2C illustrates an angled view of a portion of a tri-gate or finfet Ge homojunction based TFET device, in accordance with an embodiment of the present invention.

Generally, FIG. 2C illustrates an angled view of a portion 200C of a tri-gate or finfet Ge homojunction based TFET device, in accordance with an embodiment of the present invention. In one embodiment, the device is fabricated by cutting a layer region into a fin a the channel region of planar biaxial tensile strained Ge film. Ge strain may be derived from a Ge film grown pseudomorphically on a relaxed substrate having a larger lattice constant. In an embodiment, possible choices for the substrate include, but are not limited to, $Ge_{1-x}Sn_x$ or $In_xGa_{1-x}As$. More specifically, referring again to FIG. 2C, the portion 200C of a TFET device includes a tensile strained active layer 204C disposed on a substrate 202C. The substrate 202C is a relaxed wide buffer having a lattice constant greater than the lattice constant of the active layer 204C. The active layer 204C is patterned to have a fin geometry 250C to provide an undoped body 206C having a thickness 207C disposed between doped source (Na/Nd) region 208C and doped drain (Nd/Na) region 210C. A gate electrode 212C and gate dielectric 214C stack is formed on the top and exposed sides of the undoped body 206C. In an embodiment, the structure 200C is used to fabricate a trigate or finfet Ge or GeSn based N-type or P-Type TFET having uniaxial tensile stress. In a specific embodiment, the device has a transport direction along a crystal orientations of <100>, <010>, or <001>.

In another example of structures for TFET devices which utilize a direct band gap transition, in an embodiment, a TFET device is based on a vertical thin body with a biaxial tensile strained Ge region used as a source, or a source/channel junction. In one such embodiment, for dimension considerations, the Ge region has a vertical dimension approximately in the range of 2-4 nanometers. There are a number of possible approaches to achieving a high tensile strain for fabricating a direct gap source region with Ge, examples of which are described below in association with FIGS. 3A-3C. Although not necessarily depicted, other options for fabricating strained Ge source materials include, but are not limited to, embedding the Ge inside a relaxed GeSn or tensile strained SiGe structure.

Figure 3A:
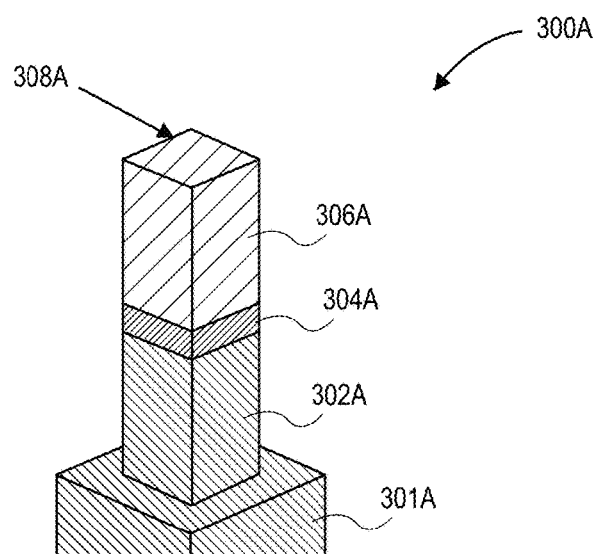
FIG. 3A illustrates an angled view of a portion of a vertical TFET device having a tensile strained Ge region, in accordance with an embodiment of the present invention.

In a first example, FIG. 3A illustrates an angled view of a portion 300A of a vertical TFET device having a tensile strained Ge region, in accordance with an embodiment of the present invention. Referring to FIG. 3A, the TFET device is formed above a virtual substrate 302A formed above a substrate 301A. A germanium source region 304A is included and has tensile strain. Above the germanium source region 304A is a channel region 306A and drain region 308A. In one embodiment, the channel region 306A and drain region 308B are formed from a same material, such as GeSn, as depicted in FIG. 3A. In an embodiment, the virtual substrate 302A includes a relaxed layer such as but not limited to relaxed InGaAs or relaxed GeSn. The corresponding indium or tin percent may be selected to tune the strain in the Ge layer 304A. For example, an Sn percentage of approximately 14% or an In percentage of approximately 30% may be used to provide approximately 2.5 GPa of biaxial stress in the Ge layer 304A if the Ge layer 304A is deposited as a blanket film. It is to be understood, however, that due to relaxation caused by forming a vertical wire, higher mismatches may be needed to achieve highly strained Ge in the final device. In an embodiment, by using a square layout, as depicted in FIG. 3A, the stress can be made more biaxial. Although not shown, it is to be understood that a gate stack, including a gate dielectric layer and a gate electrode layer, is formed to at least partially, if not completely, surround channel region 306A.

Figure 3B:
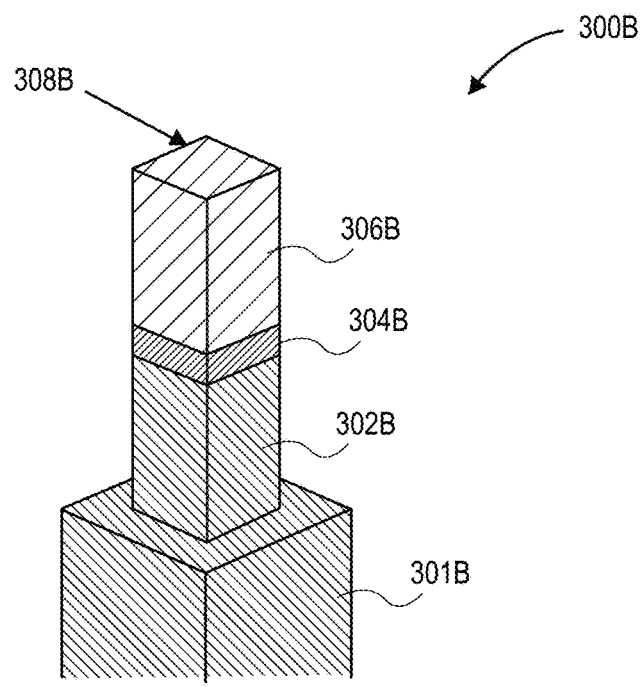
FIG. 3B illustrates an angled view of a portion of another vertical TFET device having a tensile strained Ge region, in accordance with an embodiment of the present invention.

In a second example, FIG. 3B illustrates an angled view of a portion 300B of another vertical TFET device having a tensile strained Ge region, in accordance with an embodiment of the present invention. Referring to FIG. 3B, the TFET device is formed above a strained layer 302B formed above a virtual substrate 301B. A germanium source region 304B is included and has tensile strain. Above the germanium source region 304B is a channel region 306B and drain region 308B. In one embodiment, the strained layer 302B, the channel region 306B, and the drain region 308B are formed from a same material, such as strained GeSn, as depicted in FIG. 3B. In an embodiment, the virtual substrate 301B is a relaxed Ge virtual substrate. In an embodiment, the GeSn layer 302B is formed as a compressively strained layer. The Ge layer 304B is deposited as a strain-free layer and then capped with compressively strained GeSn 306B/308B. In an embodiment, upon patterning such a material stack into a wire, the elastic relaxation of the GeSn stretches the Ge (layer 304B) causing it to be tensile. Although not shown, it is to be understood that a gate stack, including a gate dielectric layer and a gate electrode layer, is formed to at least partially, if not completely, surround channel region 306B.

Figure 3C:
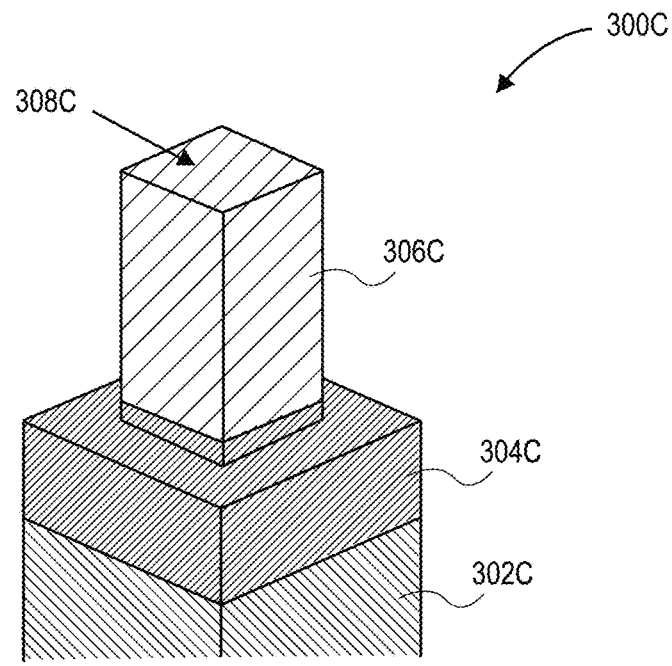
FIG. 3C illustrates an angled view of a portion of yet another vertical TFET device having a tensile strained Ge region, in accordance with an embodiment of the present invention.

In a third example, FIG. 3C illustrates an angled view of a portion 300C of another vertical TFET device having a tensile strained Ge region, in accordance with an embodiment of the present invention. Referring to FIG. 3C, the TFET device is formed above a virtual substrate 302C. A germanium source region 304C is included and has tensile strain. Above the germanium source region 30CB is a channel region 306C and drain region 308C. In one embodiment, the channel region 306C and the drain region 308C are formed from a same material, such as strained GeSn, as depicted in FIG. 3C. In an embodiment, the virtual substrate 302C is a relaxed GeSn virtual substrate, e.g., having approximately 14% Sn. The Ge layer 304C is a tensile strained Ge, while the GeSn region 306C/308C is compressively strained and has a composition of approximately 28% Sn. It is to be understood that other materials with similar lattice constants may be used instead of GeSn virtual substrate 302C. When the structure 300C is formed into a wire, in an embodiment, the compressive GeSn 306C/308C aids in retaining tensile strain in the Ge layer 304C at the interface. Although not shown, it is to be understood that a gate stack, including a gate dielectric layer and a gate electrode layer, is formed to at least partially, if not completely, surround channel region 306C.

In another example of structures for TFET devices which utilize a direct band gap transition, in an embodiment, a TFET device is based on a vertical thin body with a biaxial tensile strained $Ge_{1-y}Sn_y$ region used as a source, or a source/channel junction. In one such embodiment, for dimensional considerations, the $Ge_{1-y}Sn_y$ region has a vertical dimension approximately in the range of 2-4 nanometers. There are a number of possible approaches to achieving a high tensile strain for fabricating a direct gap source region with $Ge_{1-y}Sn_y$, an example of which is described below in association with FIG. 4.

Figure 4:
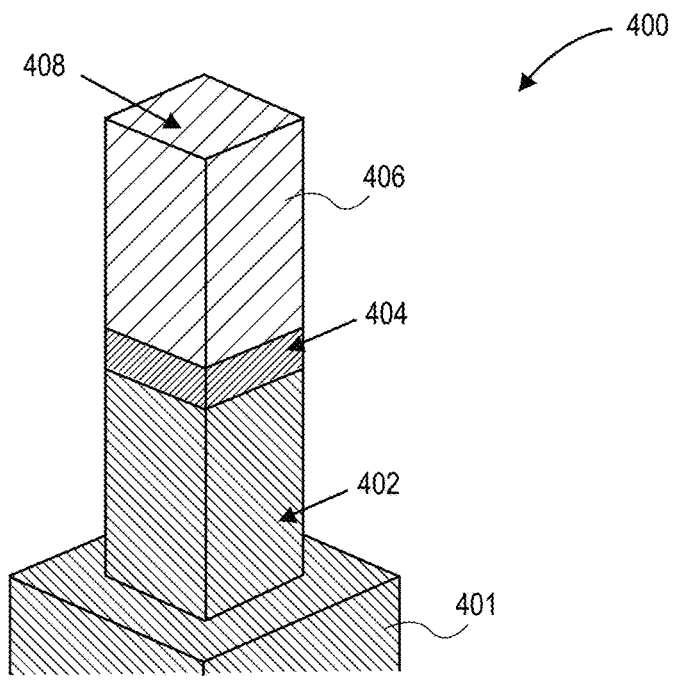
FIG. 4 illustrates an angled view of a portion of a vertical TFET device having a tensile strained $Ge_{1-y}Sn_y$ region, in accordance with an embodiment of the present invention.

FIG. 4 illustrates an angled view of a portion 400 of a vertical TFET device having a tensile strained $Ge_{1-y}Sn_y$ region, in accordance with an embodiment of the present invention. Referring to FIG. 4, the TFET device is formed above a virtual substrate 402 formed above a substrate 401. A germanium tin (GeSn) source region 404 is included and has tensile strain. Above the GeSn source region 404 is a channel region 406 and drain region 408. In one embodiment, the channel region 406 and drain region 408 are formed from a same material, such as GeSn, as depicted in FIG. 4. In an embodiment, the virtual substrate 402 includes a relaxed layer such as but not limited to relaxed InGaAs or relaxed GeSn. The corresponding indium or tin percent may be selected to tune the strain in the GeSn layer 404. Due to relaxation caused by forming a vertical wire, higher mismatches may be needed to achieve highly strained GeSn in the final device. In an embodiment, by using a square layout, as depicted in FIG. 4, the stress can be made more biaxial. Although not shown, it is to be understood that a gate stack, including a gate dielectric layer and a gate electrode layer, is formed to at least partially, if not completely, surround channel region 406.

In an aspect, then, approaches to achieving an indirect-to-direct band gap transition for fabricating P-type and/or N-type TFETs include the use of wafer orientation and conduction band non-parabolicity effects to increase the conduction band gamma valley mass under confinement in a thin body finfet or nanowire Ge or GeSn TFET. Such approaches provide a conduction band gamma valley energy as the lowest conduction band edge in order to realize a direct band gap.

As an example, a conduction band edge at a gamma point is parabolic in zinc blende materials, but away from the band edge it exhibits non-parabolicity based on equation (1):

$$m_\Gamma = m_{\Gamma 0}(1 + \alpha \in) \quad (1).$$

Materials with smaller bandgap exhibit larger non-parabolicity. The non-parabolicity constant $\alpha$ depends on the bandgap and effective mass in the material, as shown in equation (2):

$$\alpha = \frac{\left(1 - \frac{m^*}{m_0}\right)^2}{E_{gap}}. \quad (2)$$

Figure 5:
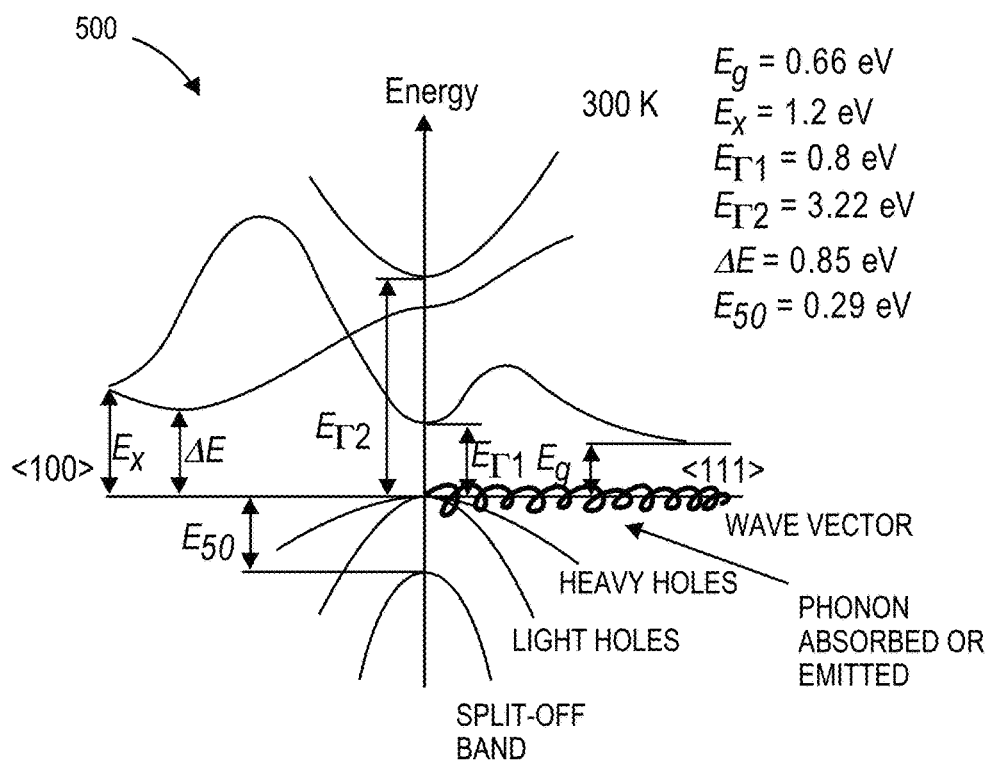
FIG. 5 is a band energy diagram 500 for bulk relaxed Ge at a temperature of approximately 300K, in accordance with an embodiment of the present invention.

For example, for germanium (Ge) gamma point effective mass $m^*$ is $0.04\ m_0$, the direct bandgap is 0.8 eV, and the non-parabolicity constant $\alpha$ is 1.15 eV$^{-1}$. For L-valley edges the non-parabolicity constant is significantly smaller at 0.3 eV$^{-1}$. In the relaxed Ge bulk band structure, the gamma valley is 0.14 eV above the L-valley, as shown in FIG. 5. For such an indirect band gap material band structure, the ballistic current is vanishingly small, and the allowed tunneling processes are phonon-assisted which have a low probability and lead to a low ON current in a relaxed thick body Ge TFET.

FIG. 5 is a band energy diagram 500 for bulk relaxed Ge at a temperature of approximately 300K, in accordance with an embodiment of the present invention. Referring to plot 500, the band gap is indirect in that the lowest in energy conduction bands are at L-points, and the top valence bands are at gamma points. The band-to-band tunneling process at the source/channel junction is a phonon assisted two-step process with low probability which leads to a low $I_{ON}$ in TFETs based on indirect bandgap materials.

In a quantum confined structure, the energy $\in$ corresponds to the shift of the band edge energy due to confinement. With stronger confinement in narrow structures, the band energy increases and, therefore, the gamma valley mass increases with a smaller structure size. The L-valley mass increases less with stronger confinement, and gamma valley becomes the lowest conduction band edge at a narrow structure size. To achieve the direct bandgap at the largest minimum structure size, in an embodiment, an optimum wafer orientation for the confinement is used. For example, in a specific embodiment, in bulk Ge there are 8 L-valleys with heavy longitudinal mass ml=$1.56\ m_0$ along the <111>, <11-1>, <–111>, and <1-11> directions (and along the corresponding opposite directions), and the light transverse mass mt=$0.082\ m_0$ along perpendicular directions. The <100> confinement direction in a finfet, or (100) confinement plane in a wire may provide the lightest mass for all L-valleys and, therefore, maximally raise the corresponding energies under confinement. Such raising of the corresponding energies under confinement may allow an indirect to direct transition to be achieved at the largest minimum structure size.

Figures 6, 7:
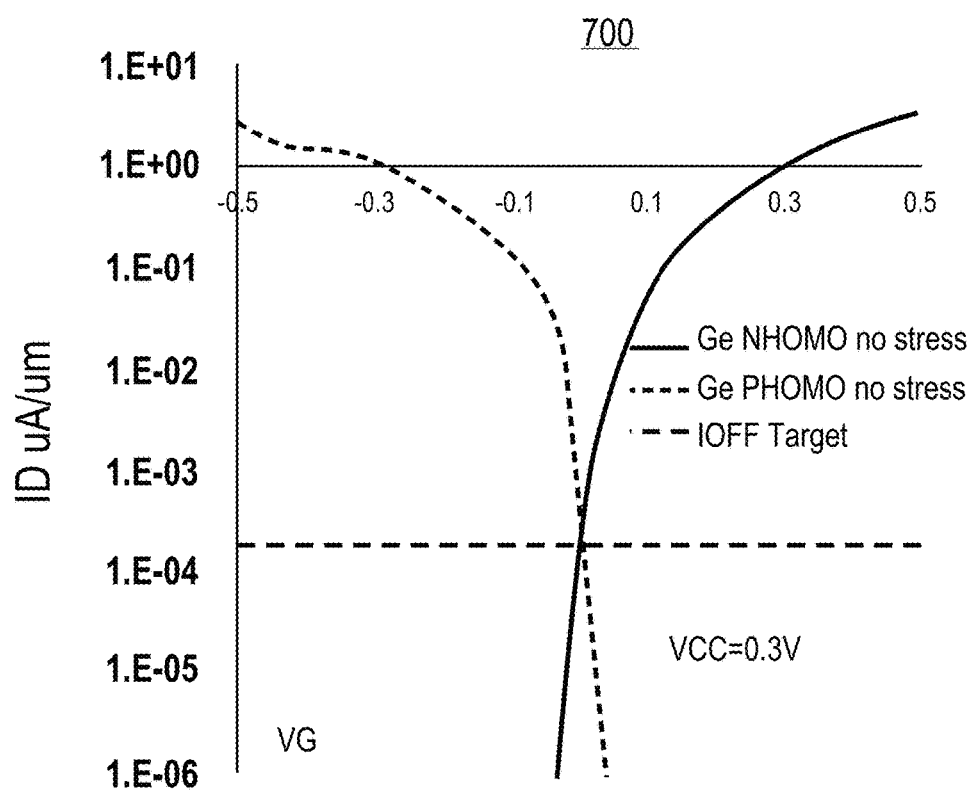
FIG. 6 is a Table of electron masses along different confinement orientations for a finfet device for four L-valleys, in accordance with an embodiment of the present invention.
FIG. 7 is a plot of simulated drain current (ID) as a function of gate voltage (VG) for N- and P-type unstrained Ge devices, in accordance with an embodiment of the present invention.

In an exemplary embodiment, FIG. 6 is a Table 600 of electron masses along different confinement orientations for a finfet device for four L-valleys. Referring to Table 600, conduction band masses (in units of electron mass) in bulk Ge along <001>, <111>, and <1-10> confinement directions are provided for the L-valleys. The gamma valley is isotropic with a mass of $0.04\ m_0$ in bulk Ge.

With an increased confinement in narrow body TFET devices, the corresponding gamma mass may increase due to the non-parabolicity effect and, at an approximately 5 nanometer body, may become the lowest conduction band leading to the direct bandgap in Ge. In such a situation, a direct ballistic tunneling current may provide a competitive high $I_{ON}$ and low SS both in the N-type and P-type Ge unstrained (100) TFETs, as simulated in FIG. 7.

FIG. 7 is a plot 700 of simulated drain current (ID) as a function of gate voltage (VG) for N- and P-type Ge devices, in accordance with an embodiment of the present invention. Referring to FIG. 7, simulated ballistic current in a narrow 5 nm body double-gate relaxed (100) Ge homojunction N-Type or P-type TFET is plotted as a function of gate overdrive. For the simulation, Lgate=40 nm, EOT=1 nm, source/drain extensions are 20 nm, source/drain dopings are 5e19 cm$^{-3}$. Relaxed Ge becomes a direct bandgap material due to the narrow body confinement leading to competitive ON current of 1 µA/µ and a min SS of 12 mV/dec in nTFET or 15 mV/dec in pTFET. The simulation involves the NEGF quantum transport method and the sp3s*d5_SO tight-binding band structure model implemented in an OMEN simulator. It is to be understood that, in accordance with an embodiment of the present invention, further increase of $I_{ON}$ can be obtained by using the hetero-structure design with the narrow body direct bandgap material in the source or in the source/channel junction.

In another aspect, approaches to achieving an indirect-to-direct band gap transition for fabricating P-type and/or N-type TFETs include the use of tensile strain in Ge, GeSn, or SiGeSn to achieve the direct band gap.

Figure 8:
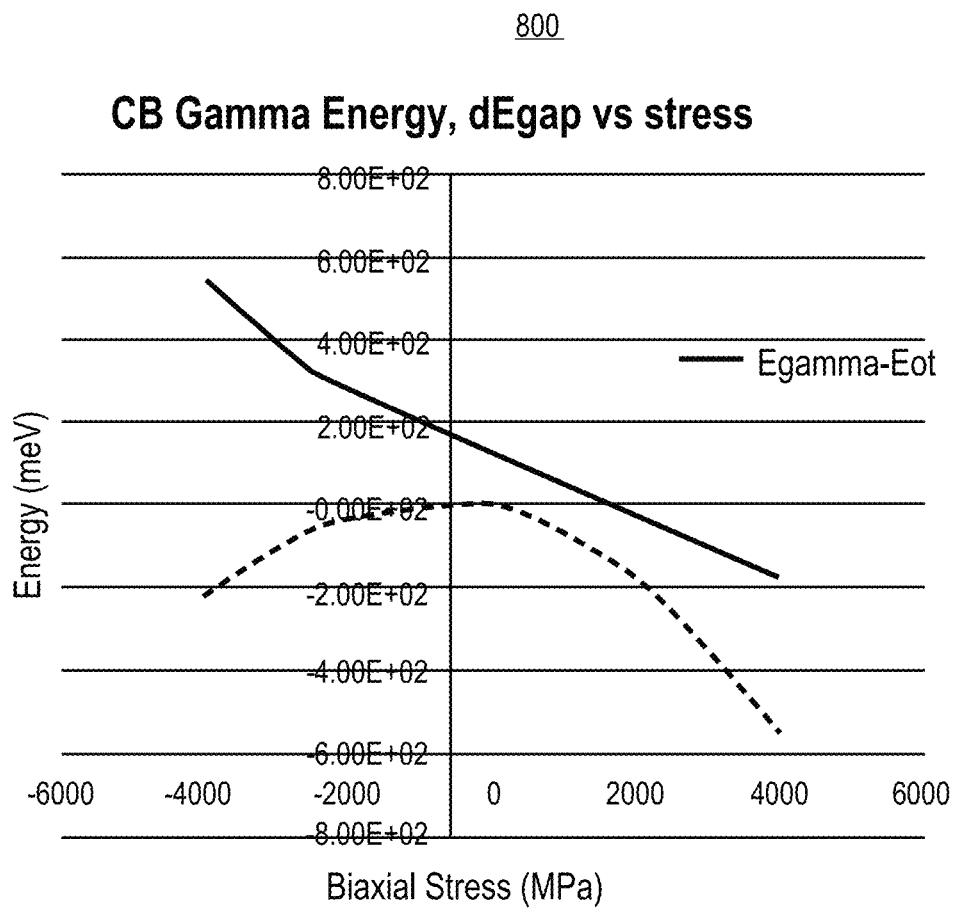
FIG. 8 is a plot of simulated energy (meV) as a function of biaxial stress (MPa) bulk Ge devices, in accordance with an embodiment of the present invention.

As an example, a tensile biaxial stress or tensile uniaxial stress along the principal crystal orientations <100>, <010>, <001> in Ge, GeSn, SiGeSn or a combination of these tensile stresses may be used to achieve the direct bandgap. In an embodiment, the applied mechanical stress breaks crystal symmetries, and splits band degeneracies. In a deformation potential theory, the band edge shifts with applied stress are linearly proportional to strains having deformation potentials as proportionality coefficients. For example, in a specific embodiment, under an applied tensile biaxial strain in bulk Ge, the gamma valley becomes the lowest band edge above 2 GPa stress as shown in FIG. 8. The corresponding band gap also narrows with stress.

FIG. 8 is a plot 800 of simulated energy (meV) as a function of biaxial stress (MPa) bulk Ge devices, in accordance with an embodiment of the present invention. Referring to plot 800, band gap narrowing and corresponding energy difference between a conduction band gamma valley edge and the closest conduction band edge of other valleys as a function of the applied biaxial stress in bulk Ge are shown. The calibrated model used applies the deformation potential theory of Bir and Pikus. In a specific embodiment, above approximately 2 GPa of tensile biaxial stress Ge becomes direct and can be used to enhance performance of N-type and P-type TFETs.

The above described approach involves use of tensile stress to achieve a direct bandgap material in Ge, GeSn, or SiGeSn in order to engineer high $I_{ON}$ and low SS in group IV materials. For example, in an embodiment, under an application of a 2.5 GPa tensile biaxial stress in narrow 5 nm body homojunction Ge—N-type and/or and P-type TFETs, the $I_{ON}$ at VG=VCC is increased by greater than approximately 5× in both N-type and P-type Ge TFETs, as shown simulated in FIG. 9A. In one such embodiment, approximately twice the amount of uniaxial tensile stress is needed to achieve the direct bandgap in Ge. However, less hydrostatic tensile stress may be needed to achieve the direct bandgap in Ge. The Ge P-type TFET with the direct bandgap due to the combined effect of confinement and stress shows an advantage of approximately 3× lower SS than in the simulated 5 nm body III-V material P-type TFET, as depicted in FIG. 9B.

Figure 9A:
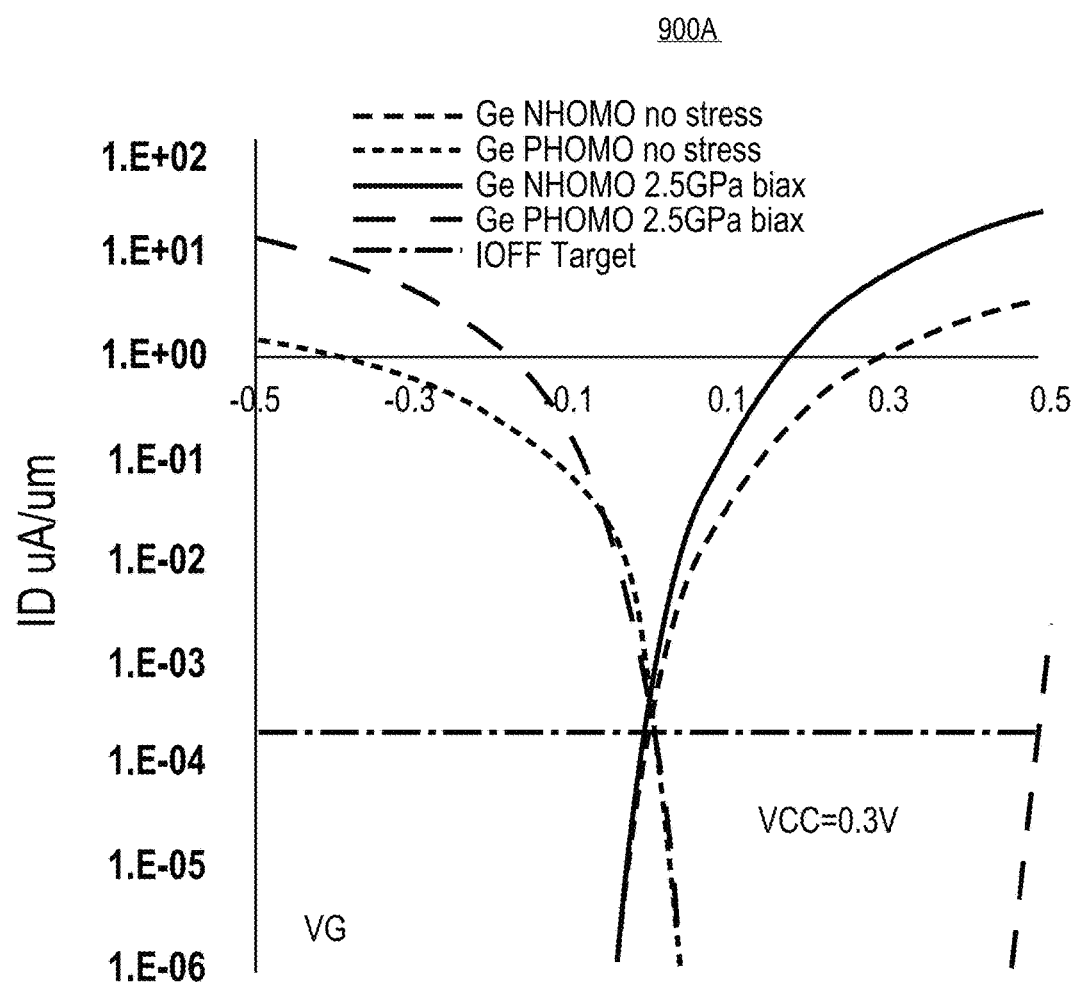
FIG. 9A is a plot of simulated drain current (ID) as a function of gate voltage (VG) for N- and P-type strained and unstrained Ge devices, in accordance with an embodiment of the present invention.

FIG. 9A is a plot 900A of simulated drain current (ID) as a function of gate voltage (VG) for N- and P-type Ge devices, in accordance with an embodiment of the present invention. Referring to plot 900A, simulated ballistic drain current is observed in a narrow (100) 5 nm body double-gate relaxed and under 2.5 GPa tensile biaxial strain Ge homojunction N-type or P-type TFET as a function of gate overdrive. For the simulation, Lgate=40 nm, EOT=1 nm, source/drain extensions are 20 nm, source/drain dopings are 5e19 cm$^{-3}$. Strained Ge is a direct bandgap material leading to ON current gains of greater than approximately 5× over the relaxed material at VG=VCC, while maintaining a low minimum SS of 19 mV/dec in the N-type TFET and 15 mV/dec in the P-type TFET. In an embodiment, further increase of $I_{ON}$ can be achieved by using the hetero-structure design with the narrow body strained direct bandgap material in the source.

Figure 9B:
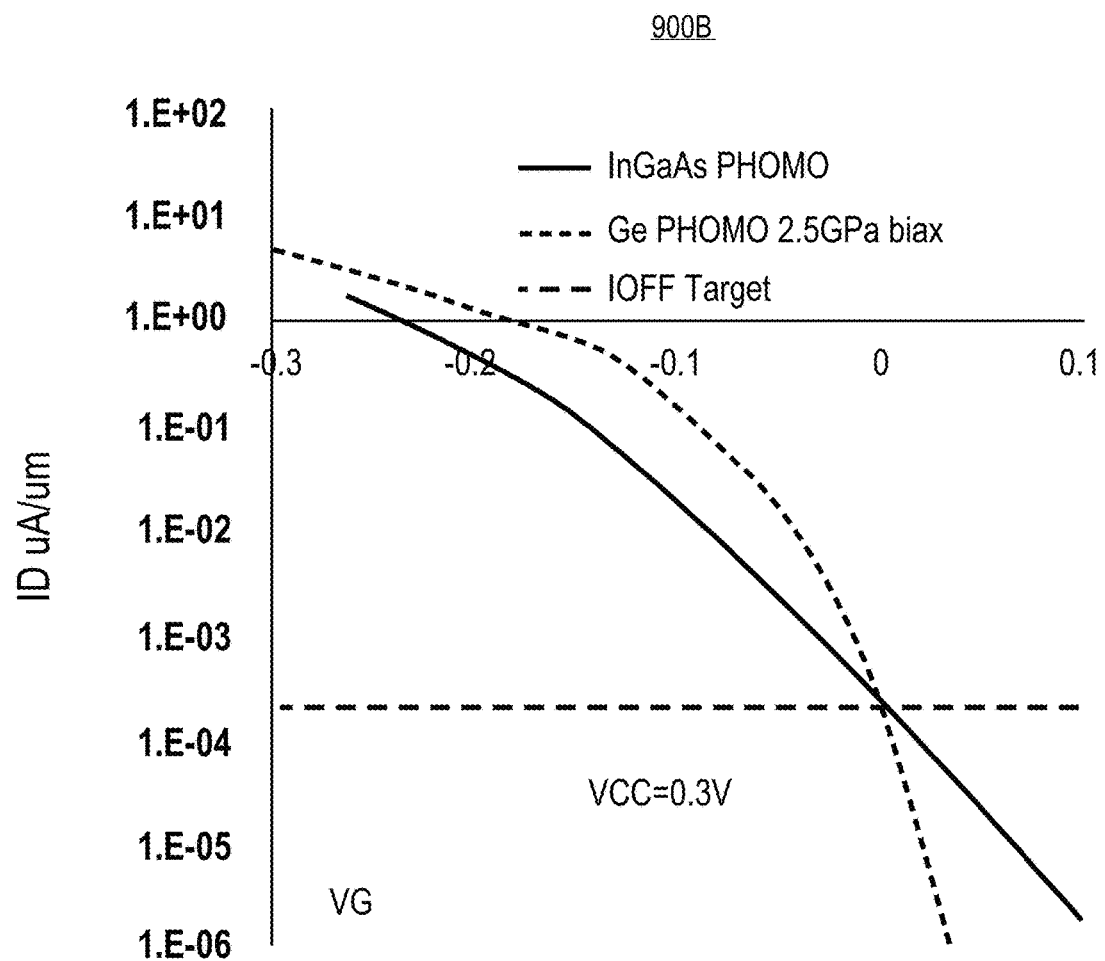
FIG. 9B is a plot of simulated drain current (ID) as a function of gate voltage (VG) in P-type strained Ge or III-V material devices, in accordance with an embodiment of the present invention.

FIG. 9B is a plot 900B of simulated drain current (ID) as a function of gate voltage (VG) P-type Ge or III-V material devices, in accordance with an embodiment of the present invention. Referring to plot 900B, simulated ballistic drain current is shown for the narrow (100) 5 nm body double-gate under 2.5 GPa tensile biaxial strain for a Ge homojunction P-type TFET and for a hetero-junction In$_{0.53}$Ga$_{0.47}$As P-type TFET with 4 nm InAs pocket at the source as a function of gate overdrive. For the simulation, Lgate=40 nm, EOT=1 nm, source/drain extensions are 20 nm, source/drain dopings are 5e19 cm$^{-3}$. As depicted in FIG. 9B, and in accordance with an embodiment of the present invention, the Ge-based P-type TFET shows approximately 3× lowering of SS as compared with the III-V material-based P-type TFET.

In the above described approach to achieving a direct band gap in TFETs, a tensile stress in the finfet or a nanowire is used. The tensile stress effect can be combined with a narrow body confinement effect to maximize the TFET performance. Such an approach can be implemented in planar biaxially strained Ge, GeSn, SiGeSn pseudomorphic films or in narrow body Ge homojunction TFET, or narrow body Ge source—GeSn hetero-structures. In one such embodiment, indirect band gap to direct bandgap transitions due to applied tensile stress in GeSn for Sn content less than approximately 6% can be used.

In another aspect, approaches to achieving an indirect-to-direct band gap transition for fabricating P-type and/or N-type TFETs include the use of alloying of Ge with Sn in relaxed GeSn or SiGeSn to achieve a direct band gap.

Figure 10A:
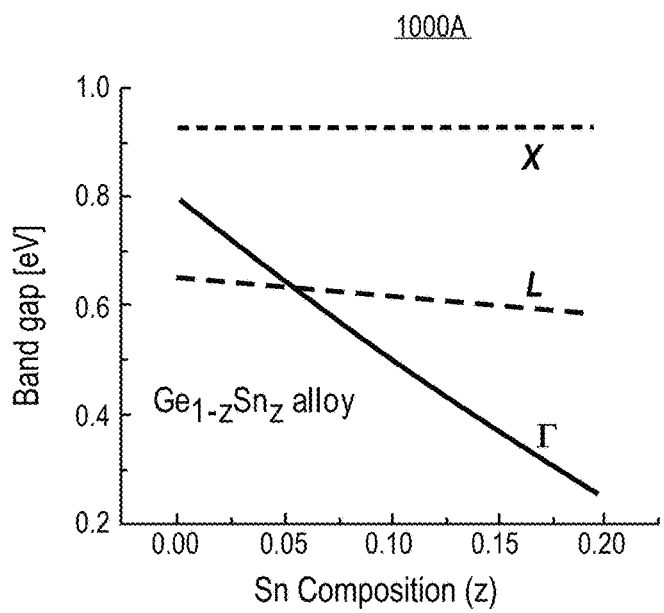
FIG. 10A is a plot 1000A showing the direct and indirect band gap in GeSn versus Sn content calculated using the Jaros' band offset theory, in accordance with an embodiment of the present invention.
Figure 10B:
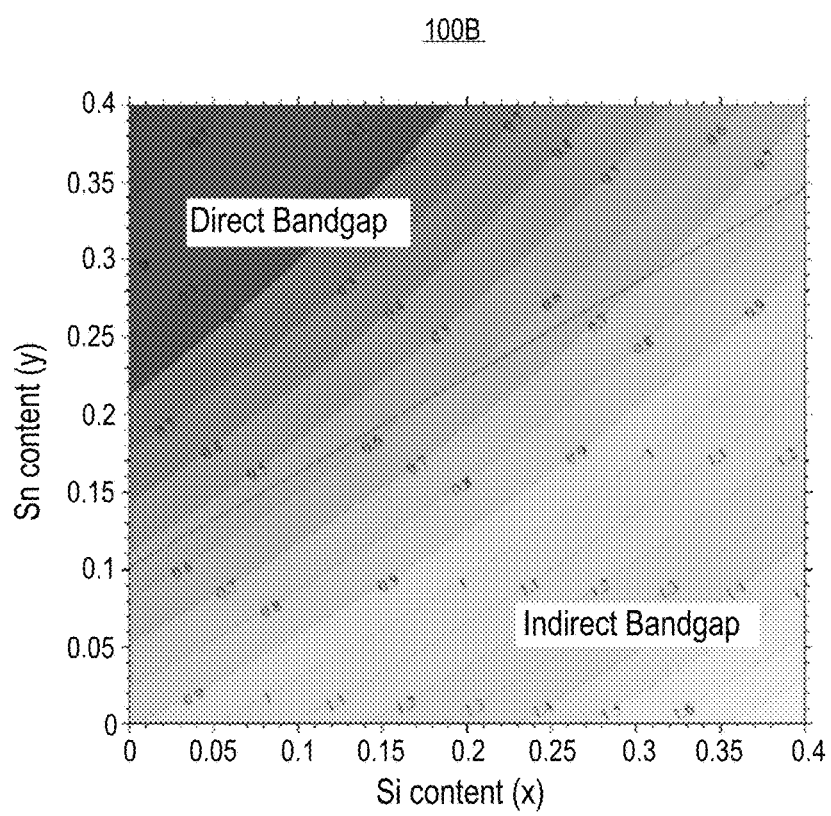
FIG. 10B is a plot 1000B depicting the transition for a $Ge_{1-x-y}Si_xSn_y$ ternary alloy, in accordance with an embodiment of the present invention.

In an example, it is to be understood that Ge is an indirect bandgap material, while Sn is a metal. During alloying Ge with Sn, the resulting GeSn undergoes an indirect-band gap-direct-band gap transition for Sn concentrations above approximately 6%-10%. In accordance with an embodiment of the present invention, the direct and indirect bandgap in GeSn vs Sn content calculated using the Jaros' band offset theory are shown in FIG. 10A. The transition for the Ge$_{1-x-y}$Si$_x$Sn$_y$ ternary alloy is shown in FIG. 10B. Referring to FIGS. 10A and 10B, band gaps of Ge$_{1-z}$Sn$_z$ at L, gamma, and X conduction band valleys versus Sn composition of z shows the indirect-to direct bandgap transition above 6% of Sn. The lowest (either direct or indirect) band gap of relaxed Ge$_{1-x-y}$Si$_x$Sn$_y$ alloys may be calculated by empirical pseudopotential method. For such an approach, the alloy GeSn or SiGeSn is used to provide a direct band gap in TFETs. The alloy effect may be combined with a narrow body confinement effect, and tensile stress effect to maximize the TFET performance. The approach may be implemented in relaxed GeSn, SiGeSn films in narrow body homojunction TFET, or narrow body GeSn/SiGeSn source—GeSn/Ge/SiGe heterostructures.

Figure 11A:
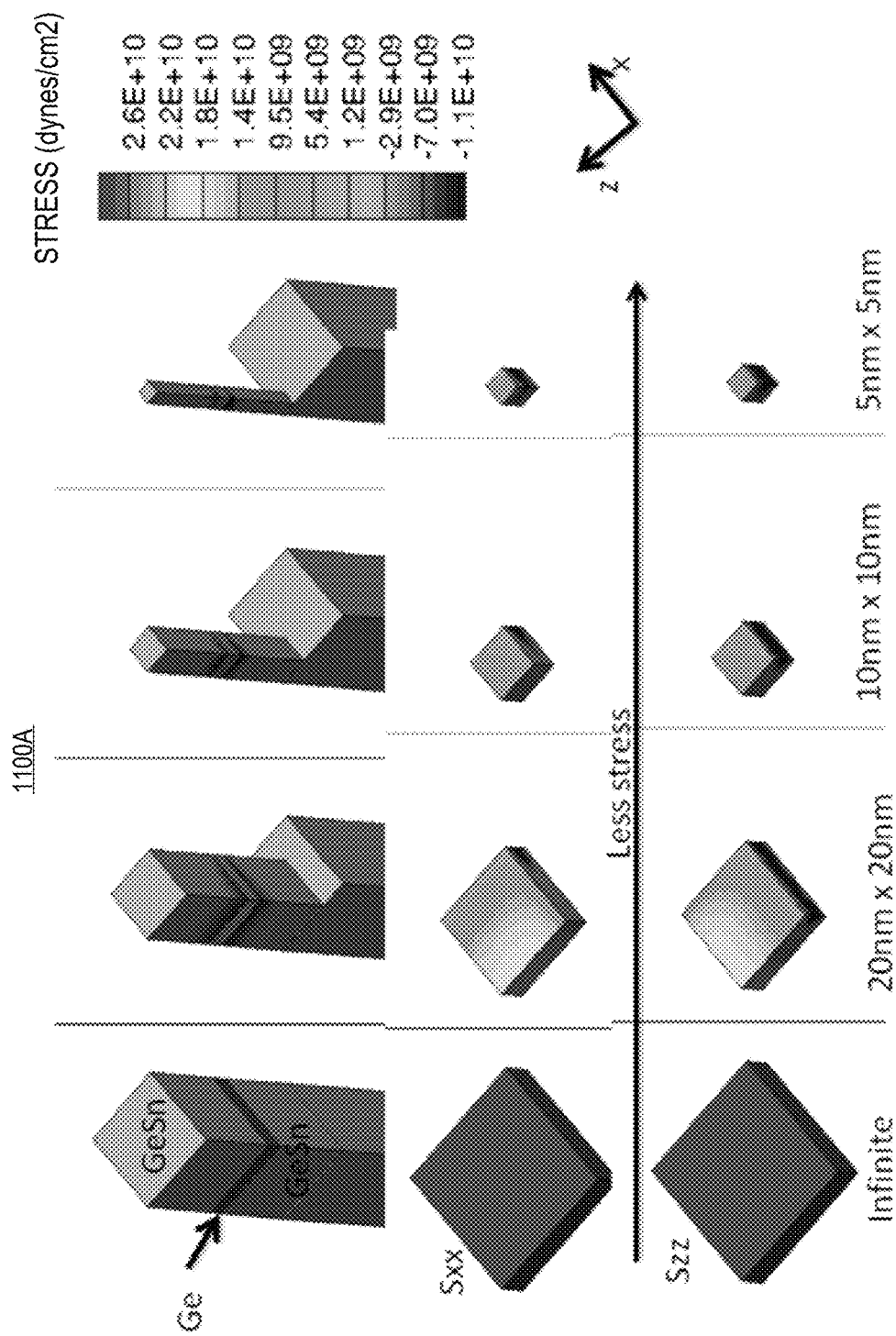
FIG. 11A is a plot depicting stress simulation of the structure shown in FIG. 3A for varying wire dimensions, in accordance with an embodiment of the present invention.

In another aspect, approaches are provided to achieve stress in TFET devices which utilize direct band gap transitions under an applied stress. As an example, FIG. 11A is a plot 1100A depicting stress simulation of the structure shown in FIG. 3A for varying wire dimensions, in accordance with an embodiment of the present invention. Referring to plot 1100A, the two in plane components of the stress are plotted for the case where the deposited Ge film has 2% mismatch strain with the virtual substrate. For smaller size wires mismatch greater than 2% would be needed to achieve greater than approximately 2.5 GPa stress in the wires.

Figure 11B:
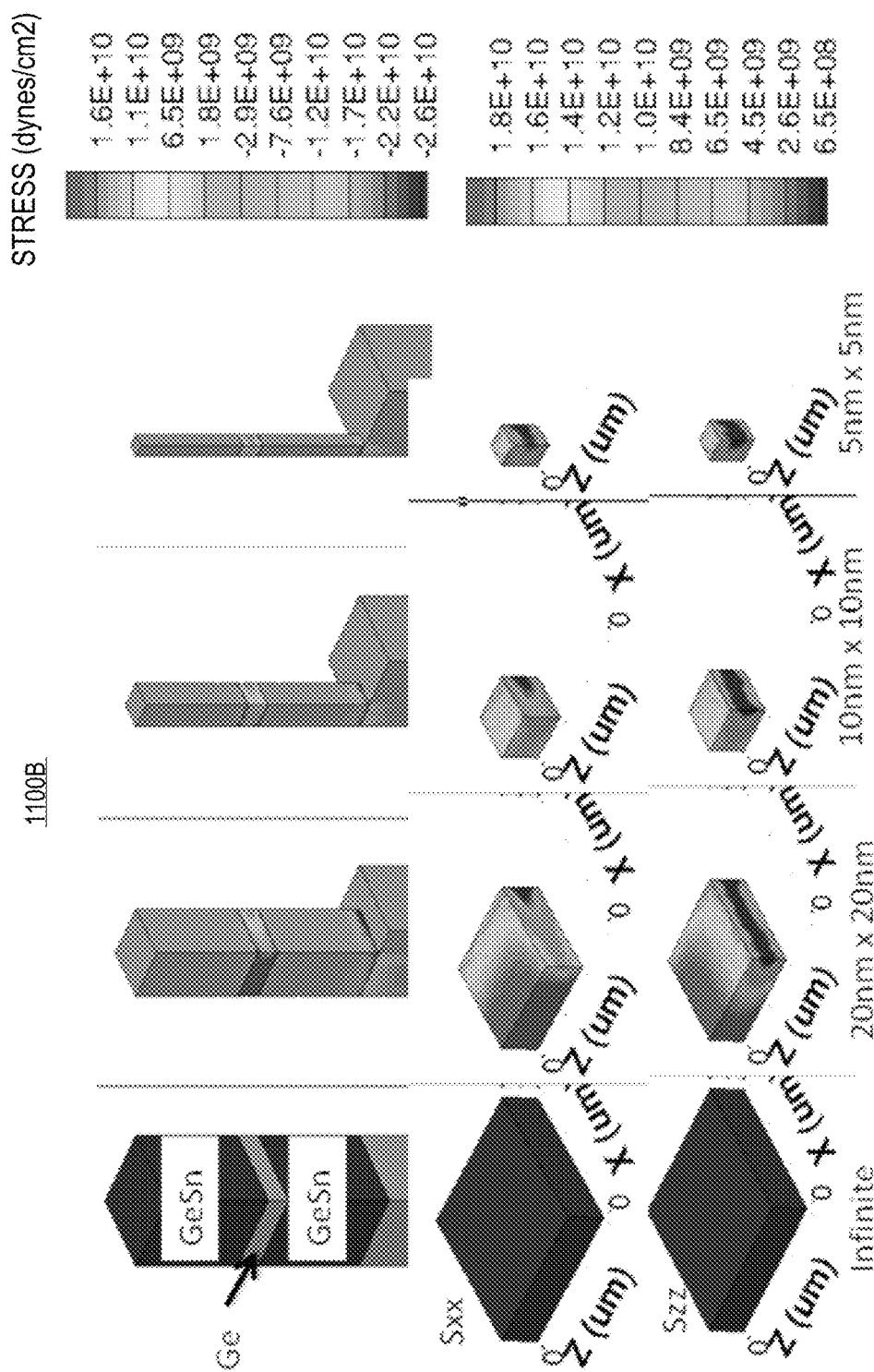
FIG. 11B is a plot depicting stress simulation of the structure shown in FIG. 3B, in accordance with an embodiment of the present invention.

In another example, FIG. 11B is a plot 1100B depicting stress simulation of the structure shown in FIG. 3B, in accordance with an embodiment of the present invention. Referring to plot 1100B, the compressively strained GeSn layers cause the Ge to be stretched out as they elastically relax causing tensile Ge. In this case, the GeSn has 2% compressive strain to begin with, as grown on a virtual substrate. The two in plane stresses (in dynes/cm$_2$) are shown for the Ge layers only. It is to be understood that higher stresses may be achieved by increasing the mismatch to the virtual substrate. One option may be to use relaxed SiGe virtual substrates instead of Ge. Such an approach may be needed for the smallest wire dimensions.

Figure 11C:
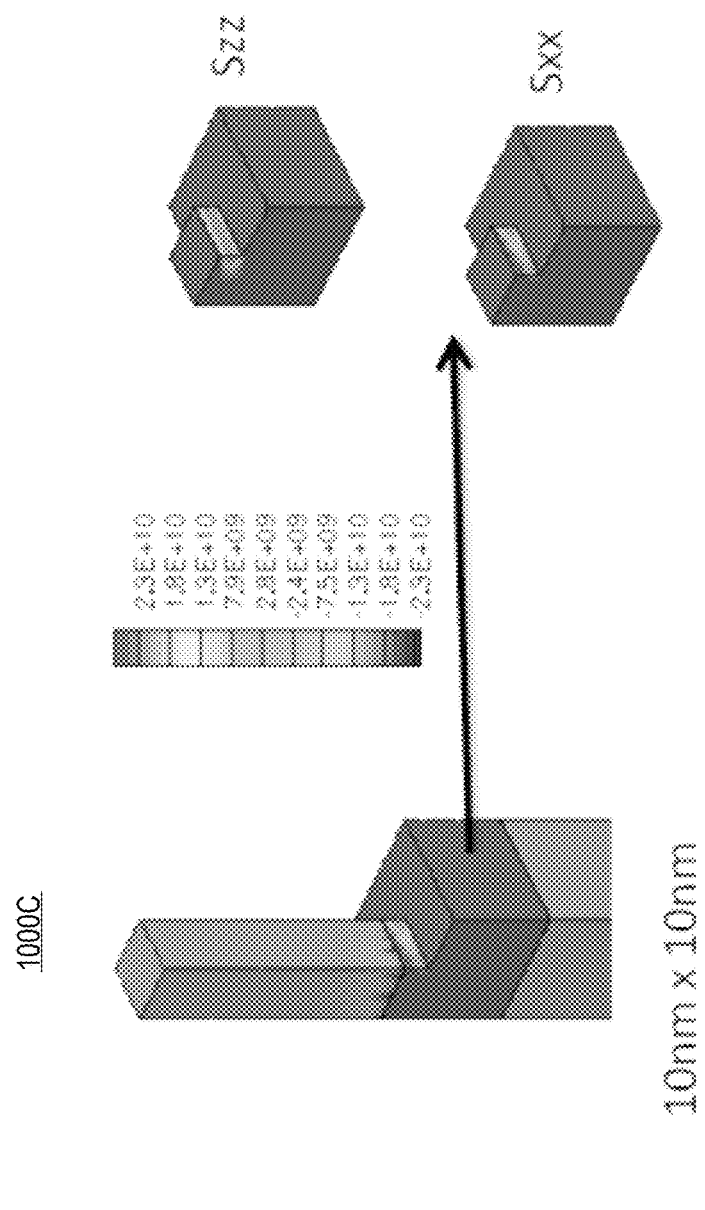
FIG. 11C is a plot depicting stress simulation of the structure shown in FIG. 3C, in accordance with an embodiment of the present invention.

In another example, FIG. 11C is a plot 1100C depicting stress simulation of the structure shown in FIG. 3C, in accordance with an embodiment of the present invention. Referring to plot 1100C, this approach results in large tensile stresses of greater than approximately 2.5 GPa at the source/channel interface. This may allow the use of lower Sn concentrations in the GeSn layers.

In the above described embodiments, whether formed on virtual substrate layers or on bulk substrates, an underlying substrate used for TFET device manufacture may be composed of a semiconductor material that can withstand a manufacturing process. In an embodiment, the substrate is a bulk substrate, such as a P-type silicon substrate as is commonly used in the semiconductor industry. In an embodiment, substrate is composed of a crystalline silicon, silicon/germanium or germanium layer doped with a charge carrier, such as but not limited to phosphorus, arsenic, boron or a combination thereof. In one embodiment, the concentration of silicon atoms in the substrate is greater than 97% or, alternatively, the concentration of dopant atoms is less than 1%. In another embodiment, the substrate is composed of an epitaxial layer grown atop a distinct crystalline substrate, e.g. a silicon epitaxial layer grown atop a boron-doped bulk silicon mono-crystalline substrate.

The substrate may instead include an insulating layer disposed in between a bulk crystal substrate and an epitaxial layer to form, for example, a silicon-on-insulator substrate. In an embodiment, the insulating layer is composed of a material such as, but not limited to, silicon dioxide, silicon nitride, silicon oxy-nitride or a high-k dielectric layer. The substrate may alternatively be composed of a group III-V material. In an embodiment, the substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In another embodiment, the substrate is composed of a III-V material and charge-carrier dopant impurity atoms such as, but not limited to, carbon, silicon, germanium, oxygen, sulfur, selenium or tellurium.

In the above embodiments, TFET devices include source drain regions that may be doped with charge carrier impurity atoms. In an embodiment, the group IV material source and/or drain regions include N-type dopants such as, but not limited to phosphorous or arsenic. In another embodiment, the group IV material source and/or drain regions include P-type dopants such as, but not limited to boron.

In the above embodiments, although not always shown, it is to be understood that the TFETs would further include gate stacks. The gate stacks include a gate dielectric layer and a gate electrode layer. In an embodiment, the gate electrode of gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the corresponding channel region. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In an embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In an embodiment, the gate electrode is composed of a P-type or N-type material. The gate electrode stack may also include dielectric spacers.

The TFET semiconductor devices described above cover both planar and non-planar devices, including gate-all-around devices. Thus, more generally, the semiconductor devices may be a semiconductor device incorporating a gate, a channel region and a pair of source/drain regions. In an embodiment, semiconductor device is one such as, but not limited to, a MOS-FET. In one embodiment, semiconductor device is a planar or three-dimensional MOS-FET and is an isolated device or is one device in a plurality of nested devices. As will be appreciated for a typical integrated circuit, both N- and P-channel transistors may be fabricated on a single substrate to form a CMOS integrated circuit. Furthermore, additional interconnect wiring may be fabricated in order to integrate such devices into an integrated circuit.

Generally, one or more embodiments described herein are targeted at tunneling field effect transistors (TFETs) for CMOS architectures and approaches to fabricating N-type and P-type TFETs. Group IV active layers for such devices may be may be formed by techniques such as, but not limited to, chemical vapor deposition (CVD) or molecular beam epitaxy (MBE), or other like processes.

Figure 12:
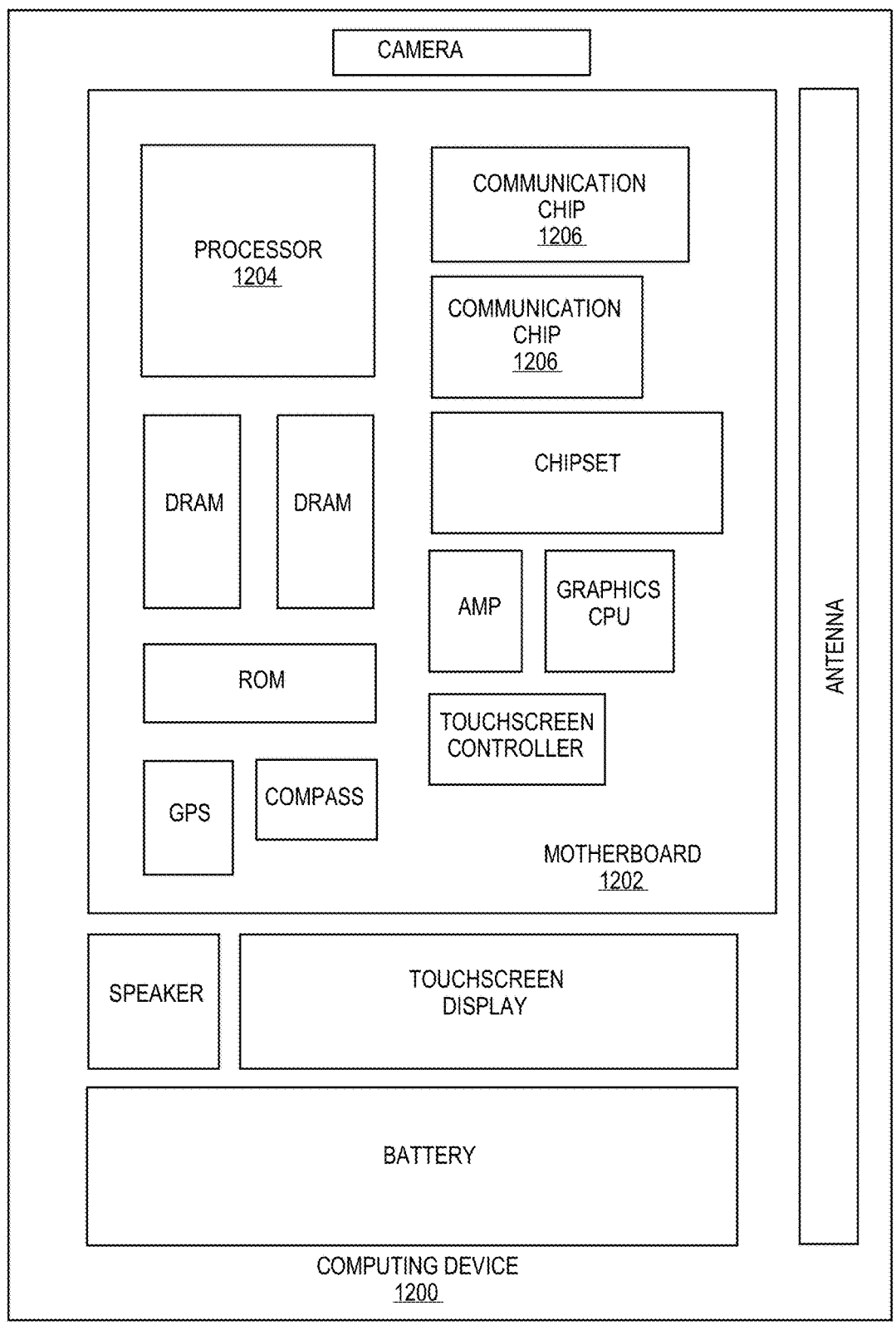
FIG. 12 illustrates a computing device in accordance with one implementation of the invention.

FIG. 12 illustrates a computing device 1200 in accordance with one implementation of the invention. The computing device 1200 houses a board 1202. The board 1202 may include a number of components, including but not limited to a processor 1204 and at least one communication chip 1206. The processor 1204 is physically and electrically coupled to the board 1202. In some implementations the at least one communication chip 1206 is also physically and electrically coupled to the board 1202. In further implementations, the communication chip 1206 is part of the processor 1204.

Depending on its applications, computing device 1200 may include other components that may or may not be physically and electrically coupled to the board 1202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1206 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 includes an integrated circuit die packaged within the processor 1204. In some implementations of the invention, the integrated circuit die of the processor includes one or more devices, such as tunneling field effect transistors (TFETs) built in accordance with implementations of the invention. The term "processor" may refer to any device or portion of a device that processes electronic data from registers and/or memory to transform that electronic data into other electronic data that may be stored in registers and/or memory.

The communication chip 1206 also includes an integrated circuit die packaged within the communication chip 1206. In accordance with another implementation of the invention, the integrated circuit die of the communication chip includes one or more devices, such as tunneling field effect transistors (TFETs) built in accordance with implementations of the invention.

In further implementations, another component housed within the computing device 1200 may contain an integrated circuit die that includes one or more devices, such as tunneling field effect transistors (TFETs) built in accordance with implementations of the invention.

In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

Thus, embodiments of the present invention include tunneling field effect transistors (TFETs) for CMOS architectures and approaches to fabricating N-type and P-type TFETs.

In an embodiment, a tunneling field effect transistor (TFET) includes a homojunction active region disposed above a substrate. The homojunction active region includes a relaxed Ge or GeSn body having an undoped channel region therein. The homojunction active region also includes doped source and drain regions disposed in the relaxed Ge or GeSn body, on either side of the channel region. The TFET also includes a gate stack disposed on the channel region, between the source and drain regions. The gate stack includes a gate dielectric portion and gate electrode portion.

In one embodiment, the relaxed Ge or GeSn body is a direct band gap body and has a thickness of, or less than, approximately 5 nanometers.

In one embodiment, the TFET is a finfet, trigate or square nanowire-based device.

In one embodiment, the doped source and drain regions include N-type dopants and the TFET is an N-type device.

In one embodiment, the doped source and drain regions include P-type dopants and the TFET is a P-type device.

In an embodiment, a tunneling field effect transistor (TFET) includes a hetero-junction active region disposed above a substrate. The hetero-junction active region includes a relaxed body having a Ge or GeSn portion and a lattice matched Group III-V material portion and having an undoped channel region in both the Ge or GeSn portion and the lattice matched Group III-V material portion. A doped source region is disposed in the Ge or GeSn portion of the relaxed body, on a first side of the channel region. A doped drain region is disposed in the Group III-V material portion of the relaxed body, on a second side of the channel region. The TFET also includes a gate stack disposed on the channel region, between the source and drain regions. The gate stack includes a gate dielectric portion and gate electrode portion.

In one embodiment, the Ge or GeSn portion of the relaxed body is a Ge portion, and the lattice matched Group III-V material portion is a GaAs or $Ga_{0.5}In_{0.5}P$ portion.

In one embodiment, the relaxed body is a direct band gap body and has a thickness of, or less than, approximately 5 nanometers.

In one embodiment, the TFET is a finfet, trigate or square nanowire-based device.

In one embodiment, the doped source and drain regions include N-type dopants and the TFET is an N-type device.

In one embodiment, the doped source and drain regions include P-type dopants and the TFET is a P-type device.

In an embodiment, a tunneling field effect transistor (TFET) includes a homojunction active region disposed above a relaxed substrate. The homojunction active region includes a biaxially tensile strained Ge or $Ge_{1-y}Sn_y$ body having an undoped channel region therein. Doped source and drain regions are disposed in the biaxially tensile strained Ge or $Ge_{1-y}Sn_y$ body, on either side of the channel region. The TFET also includes a gate stack disposed on the channel region, between the source and drain regions. The gate stack includes a gate dielectric portion and gate electrode portion.

In one embodiment, the relaxed substrate is a $Ge_{1-x}Sn_x$ (x>y) or $In_xGa_{1-x}As$ substrate.

In one embodiment, the biaxially tensile strained Ge or $Ge_{1-y}Sn_y$ body is a direct band gap body and has a thickness of, or less than, approximately 5 nanometers.

In one embodiment, the TFET is a planar, finfet, trigate or square nanowire-based device.

In one embodiment, the TFET is a finfet or trigate device, with strained Ge or $Ge_{1-y}Sn_y$ body with uniaxial tensile stress along a crystal orientation of <100>, <010> or <001>.

In one embodiment, the doped source and drain regions include N-type dopants and the TFET is an N-type device.

In one embodiment, the doped source and drain regions include P-type dopants and the TFET is a P-type device.

In an embodiment, a tunneling field effect transistor (TFET) includes a hetero-junction active region disposed above a substrate. The hetero-junction active region includes a vertical nanowire having a lower Ge portion and an upper GeSn portion and having an undoped channel region in only the GeSn portion. A doped source region is disposed in the Ge portion of the vertical nanowire, below the channel region. A doped drain region is disposed in the GeSn portion of the vertical nanowire, above the channel region. The TFET also includes a gate stack disposed surrounding the channel region, between the source and drain regions. The gate stack includes a gate dielectric portion and gate electrode portion.

In one embodiment, the lower Ge portion of the vertical nanowire is disposed on a virtual substrate portion of the substrate, and the virtual substrate is a relaxed InGaAs or relaxed GeSn virtual substrate.

In one embodiment, the lower Ge portion of the vertical nanowire is disposed on a compressively strained GeSn layer.

In one embodiment, the lower Ge portion of the vertical nanowire is disposed on a larger Ge region disposed on a virtual substrate portion of the substrate, and the virtual substrate is a relaxed GeSn virtual substrate.

In one embodiment, the GeSn virtual substrate is composed of approximately 14% Sn, and the upper GeSn portion of the vertical nanowire is compressively strained and is composed of approximately 28% Sn.

In one embodiment, the lower Ge portion has tensile strain.

In one embodiment, from a top-down perspective, the vertical nanowire has an approximately square geometry, and the tensile strain is a biaxial tensile strain.

In one embodiment, the lower Ge portion has a vertical dimension approximately in the range of 2-4 nanometers.

In one embodiment, the doped source and drain regions include N-type dopants and the TFET is an N-type device.

In one embodiment, the doped source and drain regions include P-type dopants and the TFET is a P-type device.

In an embodiment, a tunneling field effect transistor (TFET) includes a hetero-junction active region disposed above a substrate. The hetero-junction active region includes a vertical nanowire having a lower tensile strained $Ge_{1-y}Sn_y$ portion and an upper $Ge_{1-x}Sn_x$ portion and having an undoped channel region in only the $Ge_{1-x}Sn_x$ portion, where x>y. A doped source region is disposed in the $Ge_{1-y}Sn_y$ portion of the vertical nanowire, below the channel region. A doped drain region is disposed in the $Ge_{1-x}Sn_x$ portion of the vertical nanowire, above the channel region. A gate stack is disposed surrounding the channel region, between the source and drain regions. The gate stack includes a gate dielectric portion and gate electrode portion.

In one embodiment, the lower tensile strained $Ge_{1-y}Sn_y$ portion of the vertical nanowire is disposed on a virtual substrate portion of the substrate, and the virtual substrate is a relaxed InGaAs or relaxed GeSn virtual substrate.

What is claimed is:

1. An integrated circuit structure, comprising:
    a source structure above a substrate, the source structure comprising germanium, wherein the source structure comprises an upper narrow portion on a lower wide portion, the lower wide portion having a substantially flat surface around the upper narrow portion;
    a channel structure on the upper narrow portion of the source structure;
    a drain structure on the channel structure, the drain structure comprising germanium and tin; and
    a gate electrode at least partially surrounding the channel structure.

2. The integrated circuit structure of claim 1, wherein the source structure has tensile strain.

3. The integrated circuit structure of claim 1, wherein the channel structure has compressive strain, and wherein the drain structure has compressive strain.

4. The integrated circuit structure of claim 1, wherein the channel structure comprises germanium and tin, wherein the channel structure comprises approximately 28% tin, and wherein the drain structure comprises approximately 28% tin.

5. The integrated circuit structure of claim 1, wherein the substrate comprises germanium and tin.

6. The integrated circuit structure of claim 5, wherein the substrate is a relaxed substrate.

7. The integrated circuit structure of claim 5, wherein the substrate comprises approximately 14% tin.

8. The integrated circuit structure of claim 1, wherein the gate electrode completely surrounds the channel structure.

9. The integrated circuit structure of claim 1, further comprising:
    a gate dielectric layer between the gate electrode and the channel structure.

10. The integrated circuit structure of claim 1, wherein the integrated circuit structure is a vertical tunneling field effect transistor (vertical TFET) device.

11. An integrated circuit structure, comprising:
    a source structure above a substrate, the source structure comprising germanium and tin, wherein the source structure has an approximately square geometry from a top-down perspective above the substrate;
    a channel structure on the source structure, the channel structure having the approximately square geometry from the top-down perspective above the substrate;
    a drain structure on the channel structure, the drain structure comprising germanium and tin, and the drain structure having the approximately square geometry from the top-down perspective above the substrate; and
    a gate electrode at least partially surrounding the channel structure.

12. The integrated circuit structure of claim 11, wherein the channel structure comprises germanium and tin.

13. The integrated circuit structure of claim 11, wherein the source structure has tensile strain.

14. The integrated circuit structure of claim 13, wherein the tensile strain is a biaxial tensile strain.

15. The integrated circuit structure of claim 11, wherein the substrate comprises germanium and tin.

16. The integrated circuit structure of claim 15, wherein the substrate is a relaxed substrate.

17. The integrated circuit structure of claim 11, wherein the substrate comprises indium, gallium and arsenic.

18. The integrated circuit structure of claim 17, wherein the substrate is a relaxed substrate.

19. The integrated circuit structure of claim 11, wherein the gate electrode completely surrounds the channel structure.

20. The integrated circuit structure of claim 11, further comprising:
    a gate dielectric layer between the gate electrode and the channel structure.

21. The integrated circuit structure of claim 11, wherein the integrated circuit structure is a vertical tunneling field effect transistor (vertical TFET) device.

* * * * *